US007320606B2

(12) United States Patent
Midorikawa

(10) Patent No.: US 7,320,606 B2
(45) Date of Patent: Jan. 22, 2008

(54) ELECTRICAL CONNECTOR WITH TERMINAL HAVING FLAT INDENTATION

(75) Inventor: Kazuya Midorikawa, Tokyo (JP)

(73) Assignee: Hirose Electric, Co., Ltd., Tokyo (JP)

( * ) Notice: Subject to any disclaimer, the term of this patent is extended or adjusted under 35 U.S.C. 154(b) by 0 days.

(21) Appl. No.: 11/489,449

(22) Filed: Jul. 20, 2006

(65) Prior Publication Data

US 2007/0020967 A1 Jan. 25, 2007

(51) Int. Cl.
*H01R 12/00* (2006.01)
*H05K 1/00* (2006.01)

(52) U.S. Cl. .......................................... 439/74; 439/660

(58) Field of Classification Search .................. 439/74, 439/660, 848
See application file for complete search history.

(56) References Cited

U.S. PATENT DOCUMENTS

| | | | | |
|---|---|---|---|---|
| 3,354,422 | A * | 11/1967 | Duris | 439/557 |
| 5,224,866 | A * | 7/1993 | Nakamura et al. | 439/81 |
| 5,954,542 | A * | 9/1999 | Wu et al. | 439/610 |
| 5,975,916 | A * | 11/1999 | Okura | 439/74 |
| 6,290,552 | B1 * | 9/2001 | Saito et al. | 439/736 |
| 6,296,524 | B1 * | 10/2001 | Goto | 439/660 |
| 6,540,561 | B1 * | 4/2003 | Masumoto | 439/660 |
| 6,846,187 | B2 * | 1/2005 | Yu | 439/74 |
| 6,866,522 | B2 * | 3/2005 | Terashima et al. | 439/74 |
| 6,986,670 | B2 * | 1/2006 | Okura et al. | 439/74 |
| 7,232,317 | B2 * | 6/2007 | Ookura | 439/74 |
| 2007/0141867 | A1 * | 6/2007 | Kishi et al. | 439/74 |

FOREIGN PATENT DOCUMENTS

| | | |
|---|---|---|
| JP | 2001-143801 | 5/2001 |
| JP | 2003-163054 | 6/2003 |
| JP | 2003-163054 A * | 6/2003 |
| WO | WO 2005096456 A1 * | 10/2005 |

OTHER PUBLICATIONS

European Search Report, Mar. 12, 2007(Completed date).

* cited by examiner

*Primary Examiner*—Hae M Hyeon
(74) *Attorney, Agent, or Firm*—Takeuchi & Kubotera, LLP

(57) ABSTRACT

The terminals of a pair of connectors are made by deforming sheet metal in the thicknesswise direction so that they are located within an interference area prior to connection. The terminal (12) of a connector (10) has a flat indentation (12B-1), while the terminal (22) of another connector (20) has a projection (22A-1) within an area corresponding to the flat indentation (12B-1). The flat indentation (12B-1) and the projection (22A-1) are located within the interference area upon connection.

6 Claims, 4 Drawing Sheets

ELECTRICAL CONNECTOR WITH TERMINAL HAVING FLAT INDENTATION

BACKGROUND OF THE INVENTION

The present invention relates to electrical connectors. In order to provide better conductivity, it is desired to increase the contact area between the terminals of a pair of connectors. Consequently, it is preferred that contact sections are provided on the surface of terminal sheet.

Japanese Patent Application Publication No. 2003-163054 discloses connectors having such terminals. The terminals are made by bending sheet metal to provide sufficient flexibility for contact. However, the contact position can be moved, providing poor contact and putting a limit to the fine arrangement of terminals. When an impact is applied to the electronic device, terminals can move to transmit the impact to the housing, resulting in the damaged housing.

Japanese Patent Application Publication No. 2001-143801 discloses a connector having a terminal with an indentation to prevent the contact position from moving, especially from lateral movement.

The terminal of JP' 801 is made by stamping so that the widthwise direction of the terminal is in the direction of thickness. That is, the terminal is not made by bending in the thicknesswise direction so that the stamping process becomes complicated, resulting in the high manufacturing cost. Also, there is provided low degrees of flexibility, requiring a long contact arm to provide a satisfactory flexibility. This leads to a large connector. To prevent this, the arm must be curved many turns, resulting in the high manufacturing cost.

According to JP' 054, the direction in which sheet metal is processed is changed to provide an inexpensive and flexible terminal. This method, however, cannot used for the terminal of JP' 801.

SUMMARY OF THE INVENTION

Accordingly, it is an object of the invention to provide an electrical connector having inexpensive and flexible terminals and capable of maintaining an accurate contact position against an impact to the electronic device.

According to the invention, the terminals of a pair of connectors are made by bending sheet metal in the thicknesswise direction so that the terminals have an interference range in the thicknesswise direction prior to connection of the connectors. More specifically, a first terminal of a first connector has a flat indentation and a second terminal of a second connector has a projection to be located within the flat indentation, forming the interference area or range.

Since the flat indentation and the projection are provided on the faces of metal sheet, there is provided a large contact area and high flexibility. Since the flat indentation and the projection are located in the interference area in the thicknesswise direction, an accurate positioning in the longitudinal and lateral directions of a terminal is provided. The regular connection is fed back with a click sound. Moreover, the manufacturing cost according to the invention is reduced.

When the electronic device is dropped, receiving an impact, the flat indentations and the corresponding projections maintain the accurate position and absorb the impact without damage to the housing.

The first terminal has a U-shaped section and a flat indentation in an outer surface of each leg. The second terminal has an S-shaped section consisting of a reversed U-shaped fixed section and a flexible section with a free end. A projection is provided on each of the fixed section and the free end at position corresponding to the flat indentation. The projection and the flat indentation may form a contact area. The other projection and the corresponding flat indentation may form a regulation area for regulating movement of the terminals in the widthwise direction.

As has been described above, the first terminal has flat indentation and the second terminal has projection within the area of the flat indentation so that the contact is restricted in the area with a sufficient contact area and flexibility. The projections are made by deforming the terminals in the widthwise or thicknesswise direction without difficulty, resulting in the low manufacturing cost. The engagement between the flat indentation and the projection is so stable that the flat indentation and the projection absorb an impact and do not damage the housing.

DESCRIPTION OF THE PREFERED EMBODIMENTS

An embodiment of the invention will now be described with reference to FIGS. 1-3.

Figure 1:
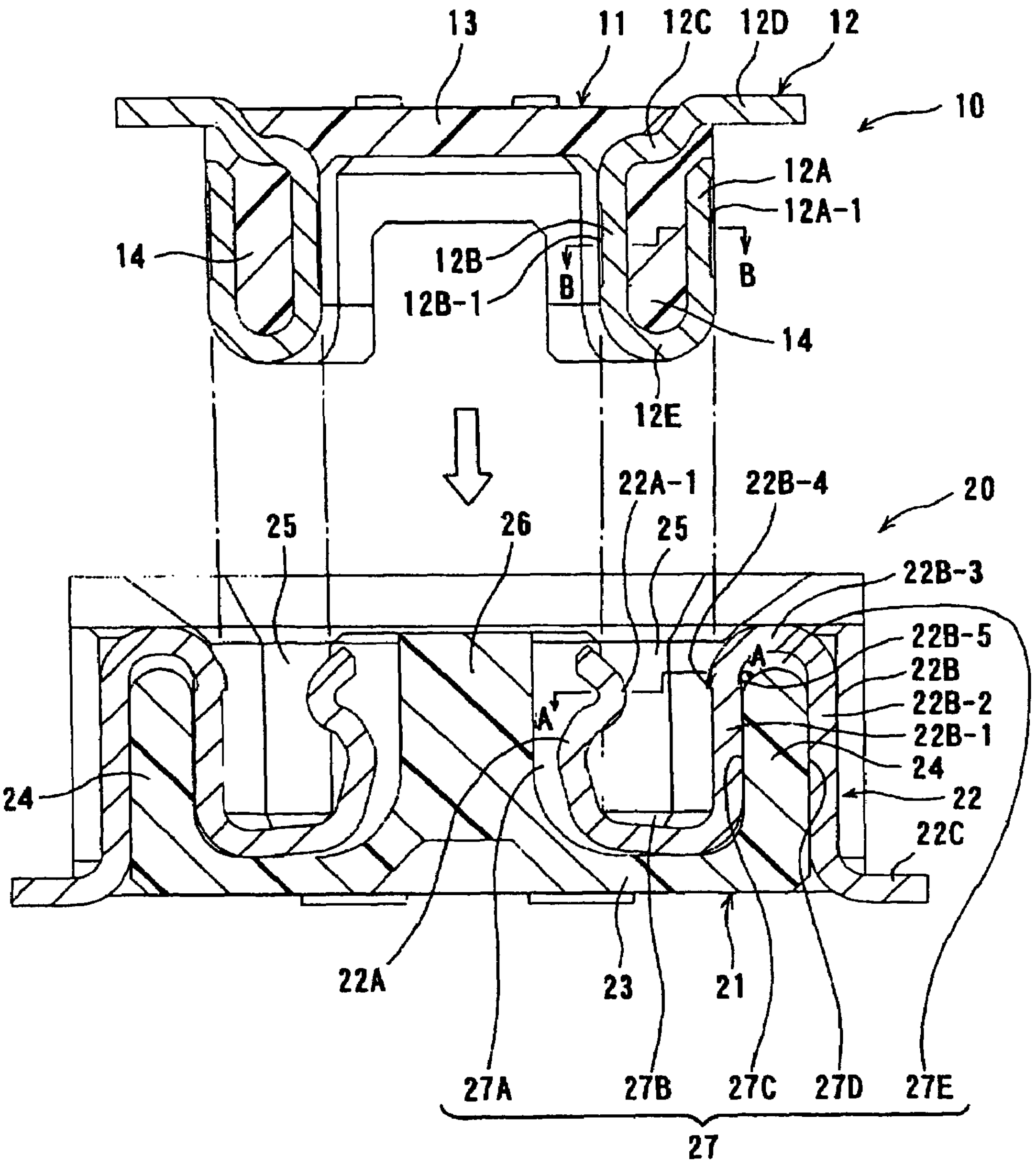
FIG. 1 is a sectional view of male and female connectors according to an embodiment of the invention.

FIG. 1 shows in section a male connector 10 and a female connector 20, which are to be connected to each other. The male connector 10 has a housing 11 made of a synthetic resin, which is dielectric, and terminals 12 made of sheet metal and supported by the housing 11 which is molded integrally with the terminals.

A pair of retention walls 14 extend forwardly from a base wall 13 of the housing 11. The inner distance between the retention walls 14 is substantially equal to the width or thickness of a central wall of the female connector 20, while the outer distance between the retention walls 14 is substantially equal to the inner distance of the outer walls of the female connector 20. That is, the central wall of the female connector 20 is fitted in between the retention walls 14 while the retention walls 14 are fitted in the recesses made between the outer walls and the central wall of the female connector 20.

Figure 2:
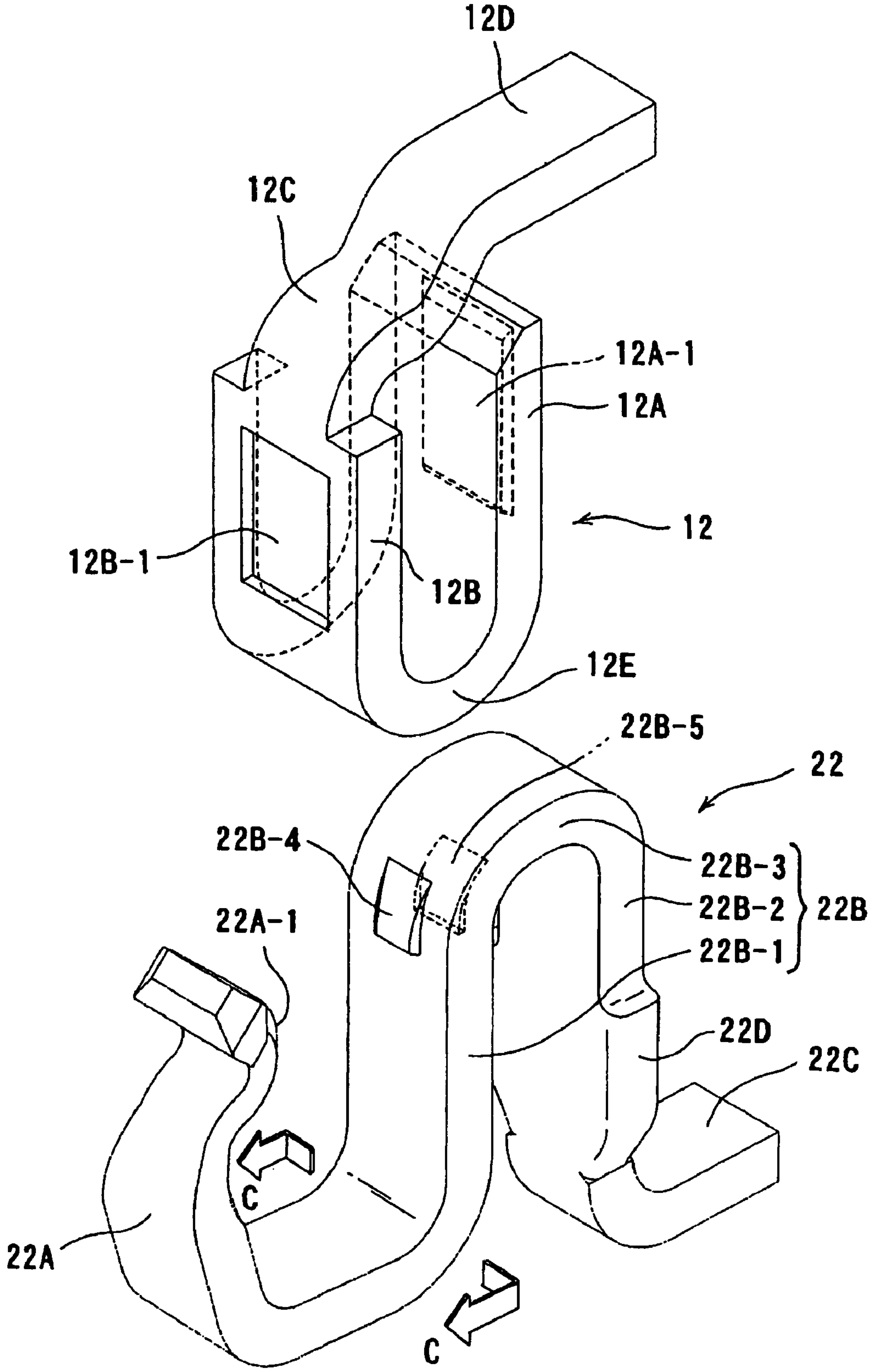
FIG. 2 is a perspective view of male and female terminals.
Figure 3:
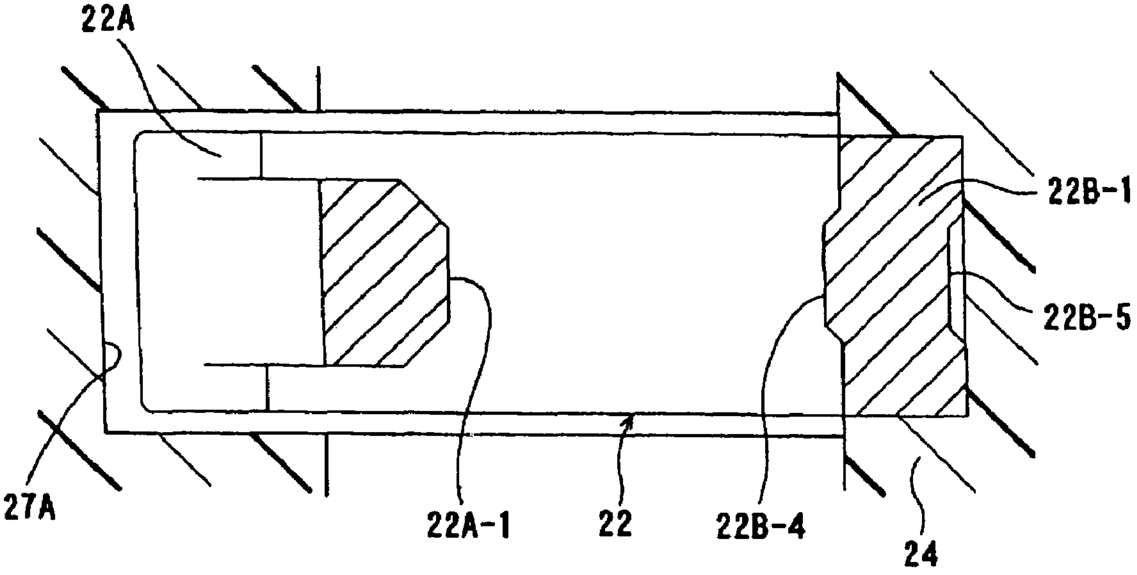
FIG. 3A is a sectional view taken along line A-A of FIG. 1.
FIG. 3B is a sectional view taken along line B-B of FIG. 1.
FIG. 3C is a sectional view taken along line C-C of FIG. 2.
Figure 3:
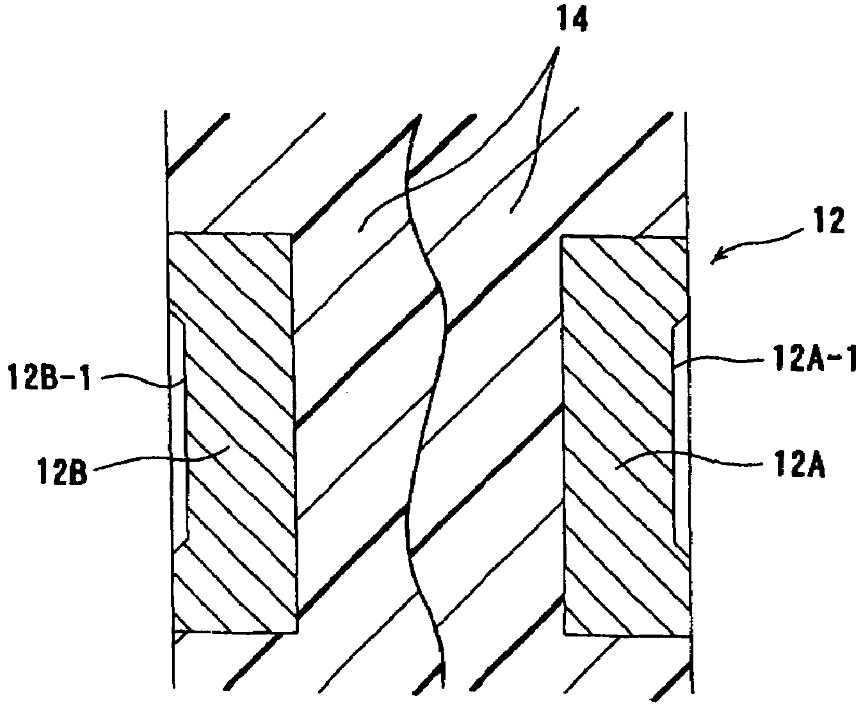
Figure 3:
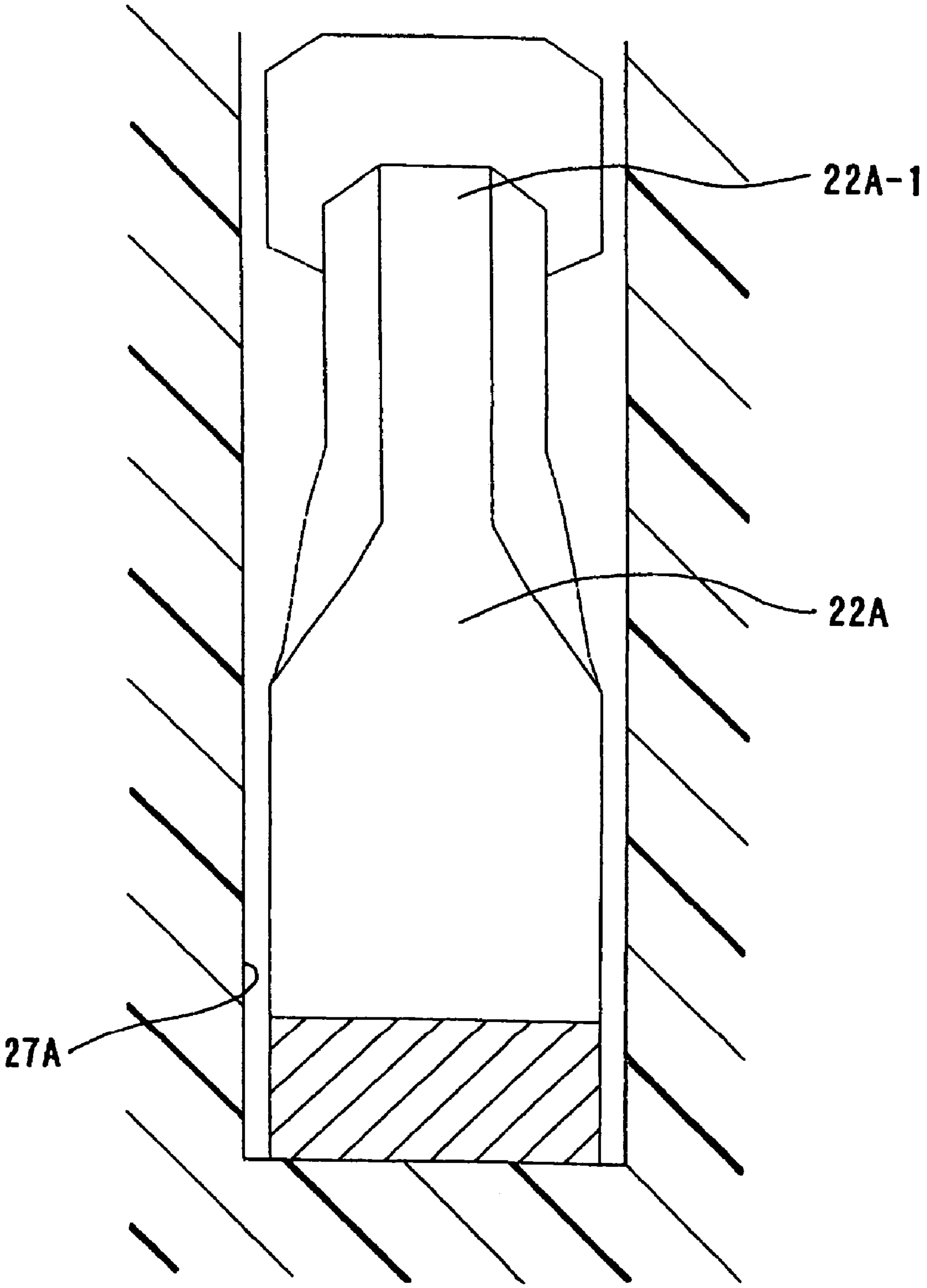

As shown in FIG. 2, the terminal 12 is made by bending sheet metal to provide a flat free end 12A with a regulation indentation 12A-1, a bottom section 12E, a flat intermediate section 12B with an indented flat contact section 12B-1, a supported section 12C diagonally extending from the flat intermediate section 12B, and a connection section 12D laterally extending from the supported section 12C. The width of the flat free end 12A and the flat intermediate section 12B is greater than the width of the supported section 12C and the connection section 12D. The rectangular regulation portion 12A-1 and contact portion 12B-1 are indented in the flat tree end 12A and flat intermediate section 12B, respectively.

As shown in FIG. 1, a plurality of terminals 12 are arranged in the retention walls 14 with a predetermined pitch in the direction perpendicular to the drawing sheet. The supported sections 12C are embedded in the housing 11 to support the terminals 12. As shown in FIG. 3B, the surfaces of the free end 12A and intermediate section 12B are level with the surface of the retention wall 14. The connection section 12D of the terminal 12 projects from the edge of the bottom wall 13 of the housing 11. The connection 12D is soldered to the corresponding trace of a circuit board.

In FIG. 1, the female connector 20 has a housing 21 and terminals 22 supported by the housing 21. Terminal retention walls 24 extend upward from the edge of a bottom wall 23 to form recesses 25 for receiving the male connector 10. A central island or wall 26 extends upward from the bottom wall 23 for fit into a space between the terminal retention walls 14 of the male connector 10.

Slits 27 are provided in the housing 21 to receive terminals 22 at the positions corresponding to the terminals 12 of the male connector 10. These slits 27 are provided on opposite sides of the central island 26 and each have a side slit 27A in the central island 26, a bottom slit 27B in the bottom wall 23, side slits 27C and 27D in the inner and outer faces of a terminal retention wall 24, and a top slit 27E in the top of the terminal retention wall 24.

In FIG. 2, the terminal 22 is made by bending sheet metal so as to have a U-shaped and reversed U-shaped sections. It has a flexible section 22A at the free end, a fixed section 22B at the reversed U-shaped section, and a connection section 22C extending from the free end of the reversed U-shaped section for connection with the corresponding trace of a circuit board.

The flexible section 22A has a contact portion 22A-1 bent toward the fixed section 22B. As shown in FIGS. 3A and 3C, the contact portion 22A-1 is made narrower than the rest of the flexible section 22A and tapered at edges. The reversed U-shaped fixed section 22B has a pair of straight sections 22B-1 and 22B-2 and a curved section 22B-3 between the straight sections 22B-1 and 22B-2. The curved section 22B-3 has a regulation boss 22B-4 at the position adjacent to the flexible section 22A. As shown in FIG. 2, the regulation boss 22B-4 is made by an embossing process which forms an indentation 22B-5 on the backside.

As shown in FIG. 1, the reversed U-shaped fixed section 22B is press fitted into the side slits 27C and 27D of the terminal retention wall 24 from above and secured to the terminal retention wall 24 with a projection 22D. When the press fit is completed, the flexible section 22A is housed in the side slit 27A and the bottom slit 27B except for the contact portion 22A-1. The convex contact portion 22A-1 projects into the recess 25 of the housing 21.

The size of contact portion 22A-1 is determined such that it rests within the indented contact portion 12B-1 of the terminal 12. The amount of projection of the contact portion 22A-1 is determined such that it can interfere with the contact portion 12B-1 of the terminal 12. This is made possible by the flexibility of the flexible section 22A when the terminals 12 and 22 come into contact with each other.

The size of regulation boss 22B-4 is made such that it can rest within the indented regulation portion 12A-1 of the terminal 12. The amount of projection of the regulation boss 22B-4 is substantially equal to or slightly less than the amount of indentation of the indented regulation portion 12A-1. The regulation boss 22B-4 gradually rises to facilitate insertion into the indented regulation portion 12A-1 and abruptly falls to form a shoulder to assure firm engagement with the indented regulation portion 12A-1. The connection section 22C of the terminal 22 projects laterally from the housing 21 at a position slightly lower than the bottom face of the housing 21.

The male and female connectors 10 and 20 are used as follows:

(1) The male and female connectors 10 and 20 are mounted on circuit boards, respectively, and the connection sections 12D and 22C are soldered to the circuit boards.

(2) The male and female connectors 10 and 20 connected to the circuit boards are brought into such a position as shown in FIG. 1.

(3) The male connector 10 is fitted into the female connector 20 as shown by an arrow.

(4) When both the connector are fitted, the regulation portion 12A-1 and the contact portion 12B-1 of the male terminal 12 are brought into contact with the regulation boss 22B-4 and the contact portion 22A-1 of the terminal 22. The contact portion 22A-1 of the terminal 22 clicks to the contact portion 12B-1 of the terminal 12 owing to the flexible section 22A. Also, the regulation boss 22B-4 clicks in the regulation portion 12A-1. The contact portion 22A-1 rests within the indented contact portions 12B-1 so that the contact position is stabilized in both lateral and longitudinal directions of the terminal. Where the connectors 10 and 20 are fitted to each other, the regulation boss 22B-4 rests within the indented regulation portion 12A-1 so that an impact on the terminal is damped and absorbed at the regulated position. The regulation portion 12A-1 is indented in the terminal 12 so that the terminal retention wall is not damaged by a lateral force received from the regulation boss 22B-4. The regulation effect produced by the regulation portions 12A-1 portion and 22B-4 is higher than that of the contact portion 12B-1 and 22A-1 because they are located on the non-flexible section. The regulation portions may be used as contact portions.

The invention claimed is:

1. An electrical connector comprising:

a first connector;

a second connector;

a first terminal provided in said first connector and made of a first sheet metal bent in a thicknesswise direction thereof so as to provide a first flat indentation therein; and a second terminal provided in said second connector and made of a second sheet metal bent in a thicknesswise direction thereof so as to provide a regulation boss which is located within an interference area, in at least a widthwise direction of said first terminal, with said first flat indentation of said first terminal when said first and second connectors are connected, wherein said first terminal, which has a U-shaped section, has said first flat indentation in an outer face of a first leg thereof such that said first flat indentation is surrounded by side edges in at least said widthwise direction so as to provide a regulation effect on said regulation boss in said widthwise direction and a second flat indentation in an outer face of a second leg thereof; and said second terminal, which has an S-shaped section consisting of a reversed U-shaped fixed section and a U-shaped flexible section with a free end, has said regulation boss on said reversed U-shaped fixed section within said interference area in said widthwise direction with said first flat indentation and a convex bend on said free end within a second interference area with said second flat indentation, said convex bend having a width smaller than that of the flexible section and a thickness smaller than that of the flexible section.

2. The electrical connector according to claim 1, wherein said convex bend, which is made narrower than the rest of said flexible section, and said second flat indentation make contact points.

3. The electrical connector according to claim 2, wherein said fixed section is provided with a bossing indentation in a backside thereof at a position corresponding to said regulation boss.

4. An electrical connector comprising:

a first connector;

a second connector;

a first terminal provided in said first connector and made of a first sheet metal bent in a thicknesswise direction thereof so as to provide a first flat indentation therein; and a second terminal provided in said second connector and made of a second sheet metal bent in a thicknesswise direction thereof so as to provide a regulation boss which is located within an interference area, in at least a widthwise direction of said first terminal, with said first flat indentation of said first terminal when said first and second connectors are connected, wherein said first terminal, which has a U-shaped section, has said first flat indentation in an outer face of a first leg thereof such that said first flat indentation is surrounded by side edges in at least said widthwise direction so as to provide a regulation effect on said regulation boss in said widthwise direction and a second flat indentation in an outer face of a second leg thereof; and said second terminal, which has an S-shaped section consisting of a reversed U-shaped fixed section and a U-shaped flexible section with a free end, has said regulation boss on said reversed U-shaped fixed section within said interference area in said widthwise direction with said first flat indentation and a convex bend on said free end within a second interference area with said second flat indentation, said convex bend having a width smaller than that of the flexible section.

5. The electrical connector according to claim 4, wherein said convex bend, which is made narrower than the rest of said flexible section, and said second flat indentation make contact points.

6. The electrical connector according to claim 5, wherein said fixed section is provided with a bossing indentation in a backside thereof at a position corresponding to said regulation boss.

* * * * *